United States Patent [19]
Gross et al.

[11] Patent Number: 6,046,433
[45] Date of Patent: Apr. 4, 2000

[54] MONOLITHIC INTEGRATED CIRCUIT DIE HEATER AND METHODS FOR USING SAME

[75] Inventors: William H. Gross, Sunnyvale; Albert Chun Hung Lee, San Francisco; Gary L. Maulding, San Jose, all of Calif.

[73] Assignee: Linear Technology Corporation, Milpitas, Calif.

[21] Appl. No.: 09/151,435

[22] Filed: Sep. 11, 1998

[51] Int. Cl.⁷ .................................................. H01L 21/66
[52] U.S. Cl. .......................... 219/209; 338/306; 257/536; 438/382
[58] Field of Search ..................................... 219/201, 209, 219/210, 243, 542; 324/71.1, 158.1; 338/32 H, 306–309; 257/536, 537; 438/238, 329, 330, 381, 382, 210

[56] References Cited

U.S. PATENT DOCUMENTS

| | | | |
|---|---|---|---|
| 4,356,379 | 10/1982 | Graeme | 219/209 |
| 4,730,160 | 3/1988 | Cusack et al. | 324/158 |
| 4,734,641 | 3/1988 | Byrd, Jr. et al. | 324/158.1 |
| 5,268,589 | 12/1993 | Dathe | 257/577 |
| 5,309,090 | 5/1994 | Lipp | 324/158.1 |

FOREIGN PATENT DOCUMENTS 64-73633  3/1989  Japan .

OTHER PUBLICATIONS

Reilly, D.F. et al, "Self–Contained Chip Heater", IBM Tech. Disclosure Bulletin, vol. 14, No. 6, Nov. 1971.
Yu, C.C., "Self–Heating Test Chip for Reliability Life Test", IBM Tech. Disclosure Bulletin, vol. 25, No. 7B, Dec. 1982.
Benson, D.A., et al., "Design and Characterization of Microscale Heater Structures for Test Die and Sensor Applications", Itherm '98, 6th Inter. Soc. Conf. on Therm. Phenom., p. 434–441 of xv, 1998.
Robert C. Dobkin, "On–Chip Heater Helps To Stabilize Monolithic Reference Zener," Electronics, 49:No. 19, pp. 106–112, Sep. 1976.

Primary Examiner—John A. Jeffery
Attorney, Agent, or Firm—Fish & Neave; James Trosino

[57] ABSTRACT

The invention provides an integrated circuit die containing a metal heater resistor. In an embodiment of the invention, the metal heater resistor is disposed around the periphery of the die, with one end of the metal heater resistor connected to a first bond pad, and the other end of the heater resistor connected to a second bond pad. In alternative embodiments, metal-to-substrate contacts disposed along the heater resistor between the first and second ends provide improved thermal contact between the heater resistor and the die substrate. In other alternative embodiments, the metal heater resistor is disposed around the periphery of a circuit whose temperature coefficient is to be measured, such as a voltage reference circuit that is included as part of a larger integrated circuit containing other circuitry.

32 Claims, 11 Drawing Sheets

MONOLITHIC INTEGRATED CIRCUIT DIE HEATER AND METHODS FOR USING SAME

FIELD OF THE INVENTION

The present invention relates to semiconductor integrated circuits. More particularly, the present invention relates to methods and apparatus for quickly and uniformly heating an integrated circuit die to measure the temperature coefficient of a circuit parameter. Even more particularly, the present invention relates to methods and apparatus for heating an integrated circuit die to measure the temperature coefficient of the output voltage of a voltage reference circuit.

BACKGROUND OF THE INVENTION

Many types of electronic circuits, such as digital-to-analog converters, voltage regulators and precision amplifiers, require a temperature-independent bias reference. The stable reference can be either a current or a voltage. For most applications, a voltage reference is preferred because it easily can be interfaced with other circuits.

High precision voltage references can achieve temperature stability of less than 10 parts-per-million per degree centigrade (ppm/° C.). Temperature compensation in monolithic integrated circuit design typically involves compensating a voltage source of predictable negative temperature drift with another voltage source of predictable positive temperature drift.

For example, the base-emitter drop ($V_{BE}$) of a bipolar transistor has a negative temperature coefficient of about –0.002 volts/° C. (V/° C.). By contrast, the temperature dependence of the $V_{BE}$ difference ($\Delta V_{BE}$) is proportional to absolute temperature through the thermal voltage $V_T$. A "band-gap" reference operates by generating a first temperature drift due to $V_{BE}$, generating a second temperature drift proportional to $V_T$ and then adding the first and second temperature drifts to obtain a nominally zero temperature dependence.

Commercially manufactured integrated circuit voltage references must provide a specified output voltage at a specified temperature coefficient. The temperature coefficient, however, is difficult to measure quickly, economically and accurately. A highly accurate way to measure the temperature coefficient of a voltage reference is to place the circuit in an oven, and then monitor the circuit's output voltage while changing temperature. This technique is time consuming, however, because the temperature of the oven interior and the circuit must stabilize for each temperature at which a measurement is required.

Measurement time can be reduced by heating only the die or the package. For example, in one previously known technique, power transistors in the voltage reference are turned ON to dissipate power and thereby heat the die. Because the power transistors generally are located in a limited portion of the die, however, this technique creates localized heating and large temperature gradients across the die. As a result, accurate measurements cannot be taken until the temperature gradient dissipates.

In another previously known technique, implemented on the LT1019 Precision Reference manufactured by Linear Technology Corporation, Milpitas, Calif., a heater resistor coupled between a "HEATER" pin and GROUND is fabricated in the silicon substrate along with the voltage reference circuits. The heater resistor has a nominal value of 400 ohms ($\Omega$) and is implemented as a diffusion resistor. Because diffusion resistors have relatively high resistivity per unit area (typically specified in ohms-per-square ($\Omega$/square)), the heater resistor on the LT1019 consumes a large area and therefore only is implemented along one side of the circuit die. As a result, the diffusion resistor heater also creates localized heating and temperature gradients across the die.

As previously mentioned, accurate temperature coefficient measurements cannot be taken until die temperature gradients dissipate. For packaged integrated circuits, the gradient dissipation time depends on, among other things, the thermal characteristics of the package. Large packages that contain large amounts of high thermal resistance material surrounding the die, such as dual in-line packages (DIP), have long thermal time constants. Because the time constant of the die temperature gradients is much shorter than the thermal time constant of such large packages, measurements can be taken before the die temperature drops significantly. Smaller packages, however, such as the miniature small-outline package (MSOP) and SOT-23 surface mount package, have shorter thermal time constants, and the die temperature drops too quickly before the die temperature gradients settle.

It therefore would be desirable to provide methods and apparatus for quickly and efficiently heating an integrated circuit die.

It also would be desirable to provide methods and apparatus for uniformly heating an integrated circuit die with minimal thermal gradients across the die.

It further would be desirable to provide methods and apparatus for quickly and uniformly heating an integrated circuit die in a packaged part.

SUMMARY OF THE INVENTION

Accordingly, it is an object of this invention to provide methods and apparatus for quickly and efficiently heating an integrated circuit die.

It also is an object of this invention to provide methods and apparatus for heating an integrated circuit die with minimal thermal gradients across the die.

It further is an object of this invention to provide methods and apparatus for quickly and uniformly heating an integrated circuit die in a packaged part.

In accordance with these and other objects of the present invention, an integrated circuit die containing a metal heater resistor is described. An embodiment of the invention is described in which a metal heater resistor is disposed around the periphery of the integrated circuit die between the scribe lines and the bonding pads. One end of the metal heater resistor is connected to a first bond pad, and the other end of the metal heater resistor is connected to a second bond pad. When the die is packaged, the first and second bond pads are connected to first and second package pins, respectively. In alternative embodiments, metal-to-substrate contacts disposed along the metal heater resistor between the first and second ends provide improved thermal contact between the metal heater resistor and the die substrate.

In other alternative embodiments of the present invention described herein, a metal heater resistor is disposed around the periphery of a portion of the circuitry on an integrated circuit die, such as a voltage reference circuit that is included in an integrated circuit die containing other circuitry. One end of the metal heater resistor is connected to a first bond pad, the other end of the heater resistor is connected to a second bond pad, and the first and second bond pads are connected to first and second package pins, respectively.

To heat the die, the first package pin is connected to GROUND, and a current source pulls current out of the second package pin (for a p-type substrate die), or injects current into the second package pin (for an n-type substrate die), dissipating power in the heater resistor to uniformly heat the integrated circuit die.

BRIEF DESCRIPTION OF THE DRAWINGS

The above-mentioned objects and features of the present invention can be more clearly understood from the following detailed description considered in conjunction with the following drawings, in which the same reference numerals denote the same structural elements throughout, and in which.

DETAILED DESCRIPTION OF THE INVENTION

Figure 1:
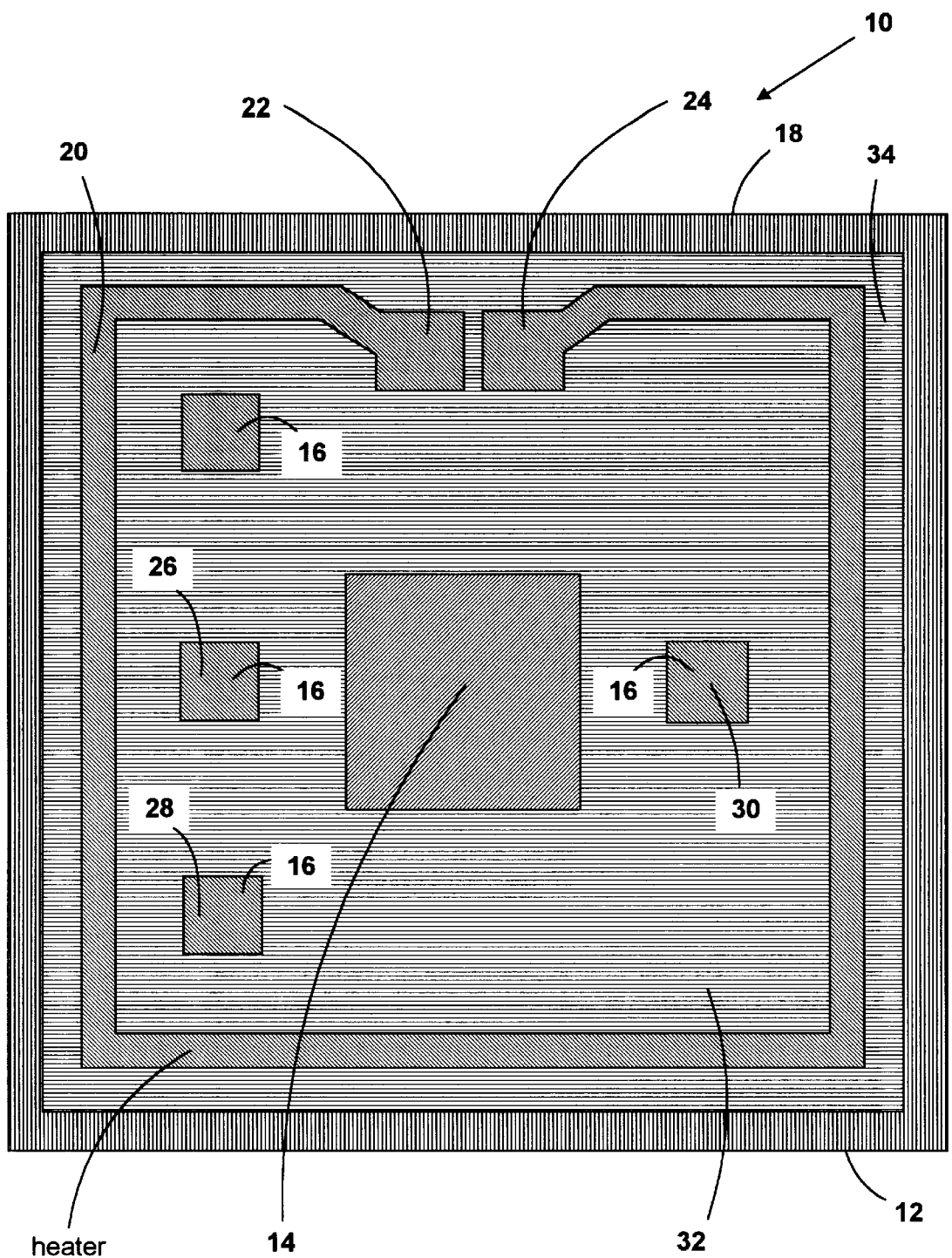
FIG. 1 is a schematic diagram of an illustrative embodiment of a monolithic die heater of the present invention.

FIG. 1 illustrates an exemplary embodiment of the die heater of the present invention. Voltage reference 10 is fabricated on die 12, which includes voltage reference circuit 14, bonding pads 16, scribe area 18, heater resistor 20, first heater pad 22, second heater pad 24, input power pad 26, substrate pad 28 and output pad 30.

Voltage reference circuit 14 includes the circuit components that comprise the voltage reference, such as a bandgap voltage reference. Substrate pad 28, which contacts substrate 32 of die 12, must be connected to prevent forward-biasing the substrate. If substrate 32 is p-type, for example, substrate pad 28 must be connected to the most negative voltage supply (e.g., GROUND). To activate voltage reference 10, a direct current (DC) voltage is applied between input power pad 26 and substrate pad 28, and voltage reference circuits 14 generate a regulated output voltage $V_{OUT}$ at output pad 30.

Heater resistor 20 is fabricated using the interconnect metal (e.g., aluminum) available as part of an integrated circuit manufacturing process. Heater resistor 20 is disposed around periphery 34 of die 12. In a preferred embodiment of the invention, heater resistor 20 is disposed between bonding pads 16 and scribe area 18. Heater resistor 20 terminates at a first end at pad 22, and at a second end at pad 24. Pad 22 may be a bonding pad dedicated to heater resistor 20. Alternatively, pad 22 may be used both as a substrate contact (thereby eliminating the need for substrate pad 28), as well as a contact for the first end of heater resistor 20. Die 12 typically is mounted in a package having pins that are connected to pads 16, 22, 24, 26, 28 and 30.

Figure 2:
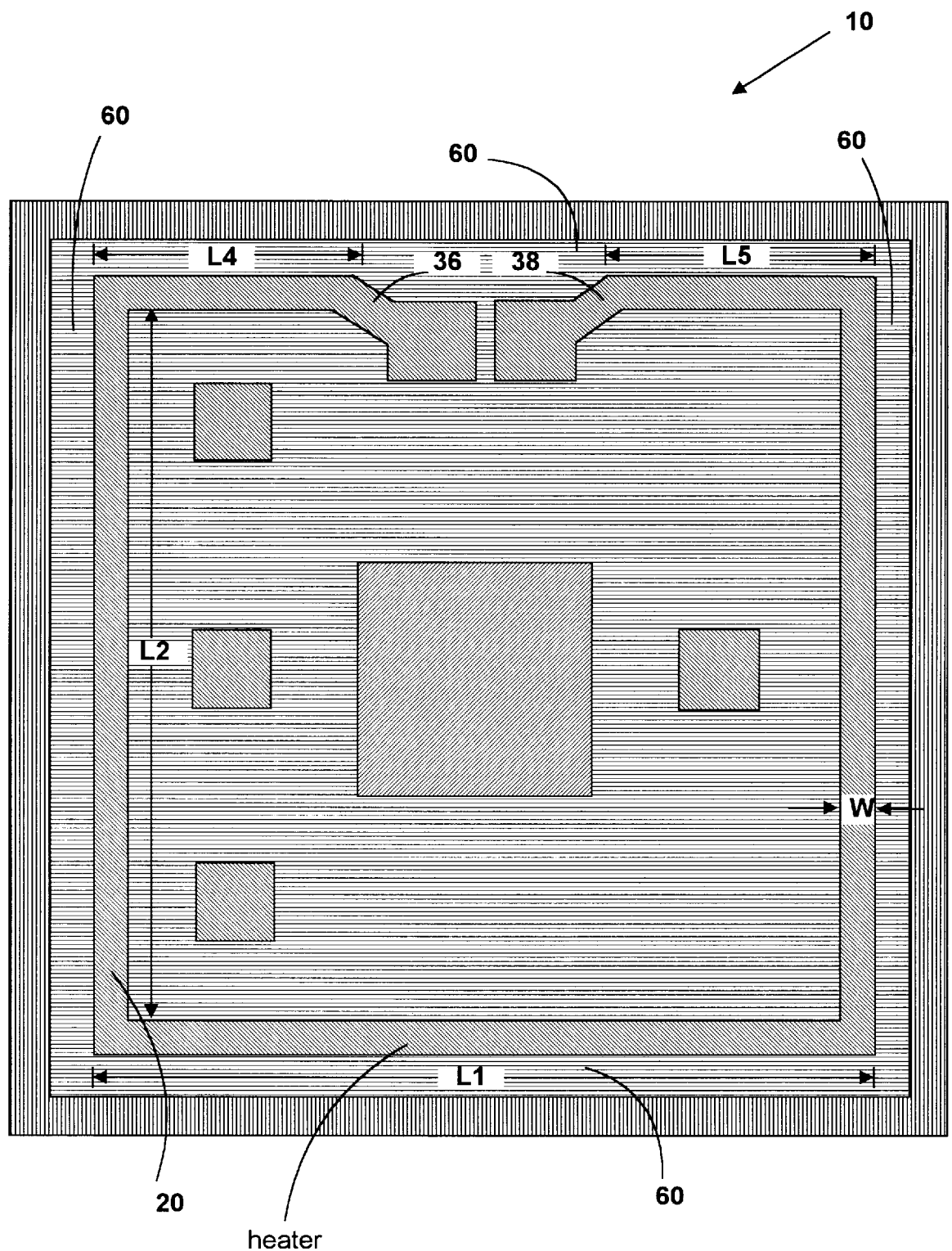
FIG. 2 is diagram showing dimensions of the monolithic die heater of FIG. 1.

Referring to FIG. 2, an exemplary layout of heater resistor 20 of FIG. 1 is described. Heater resistor 20 has width W and composite length L (ignoring the length of segments 36 and 38) equal to L1+2×L2+L4+L5. For example, if width W is 0.0015 inches and composite length L is 0.232 inches, heater resistor 20 has a total value of 0.232/0.0015=154.67 squares. If heater resistor 20 is fabricated from metal having a resistivity of 0.030Ω/square, heater resistor 20 has a resistance of 4.64Ω.

Because a portion of the die interior near the scribe lines may crack during dicing, most integrated circuit processes designated this portion as an "inactive area" that may not be used for active circuit components such as transistors, capacitors and resistors. The width of the inactive area may be on the order of about 0.001–0.0015 inches. As shown in FIG. 2, to take advantage of this die area that is required but normally unused, a portion of heater resistor 20 may be disposed in inactive area 60. For example, half the width W of heater resistor 20 may be laid out in inactive area 60. Any cracks that develop in the portion of resistor 20 in inactive area 60 typically are not fatal, because the heater resistor is normally only used during testing of circuit 14.

Figure 3:
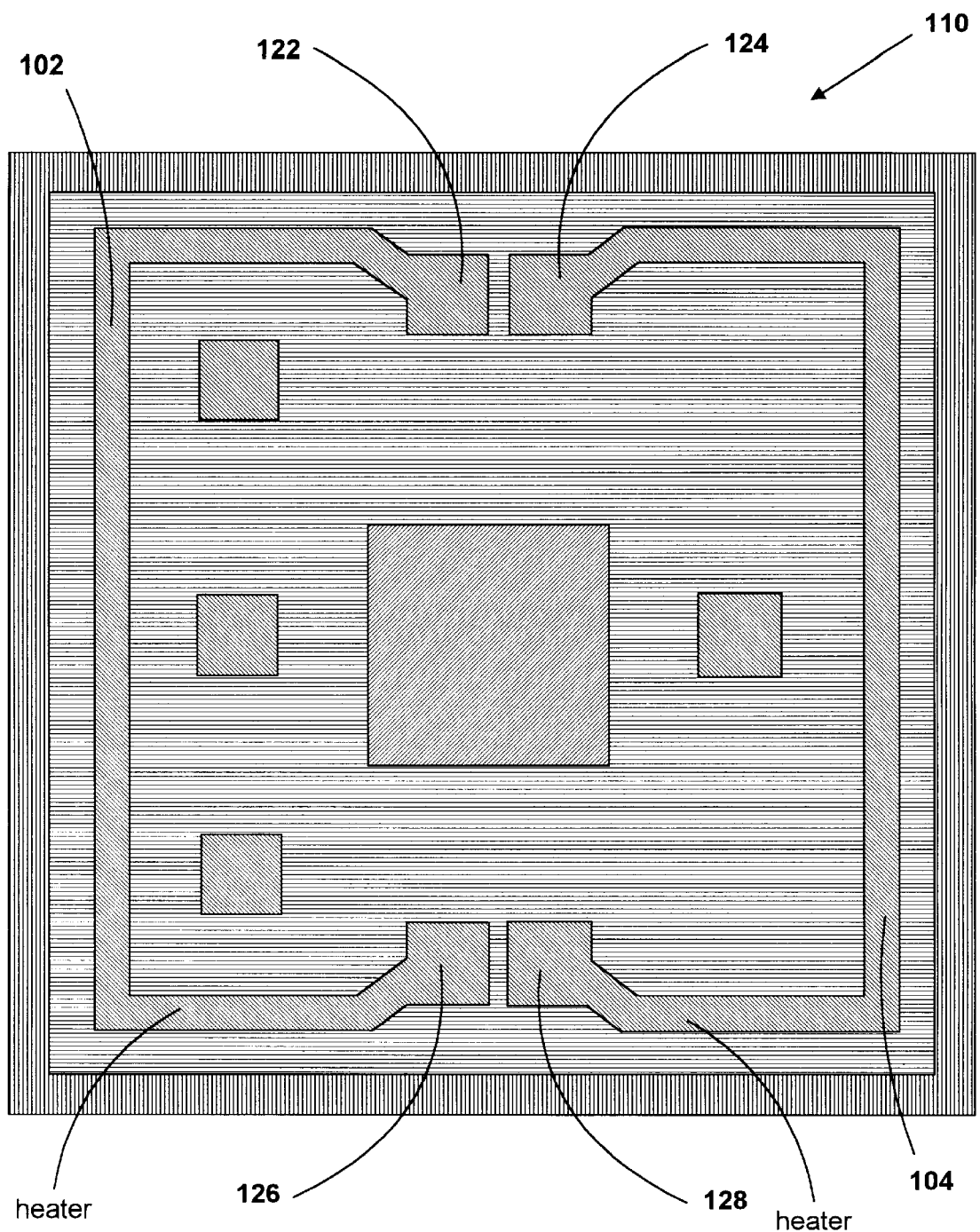
FIG. 3 is schematic diagram of an alternative embodiment of a monolithic die heater of the present invention.

The heater resistor of the present invention may be constructed in multiple segments rather than a single continuous strip of metal. FIG. 3 illustrates an alternative embodiment of the heater resistor of the present invention constructed as two segments. Voltage reference 110 includes left resistor segment 102 and right resistor segment 104. Left resistor segment 102 terminates at a first end at pad 122, and at a second end at pad 126. Right resistor segment 104 terminates at a first end at pad 124, and at a second end at pad 128. Prior to packaging, pads 126 and 128 are electrically connected, such as by wire bonding, connecting in series left and right resistor segments 102 and 104.

Figure 4:
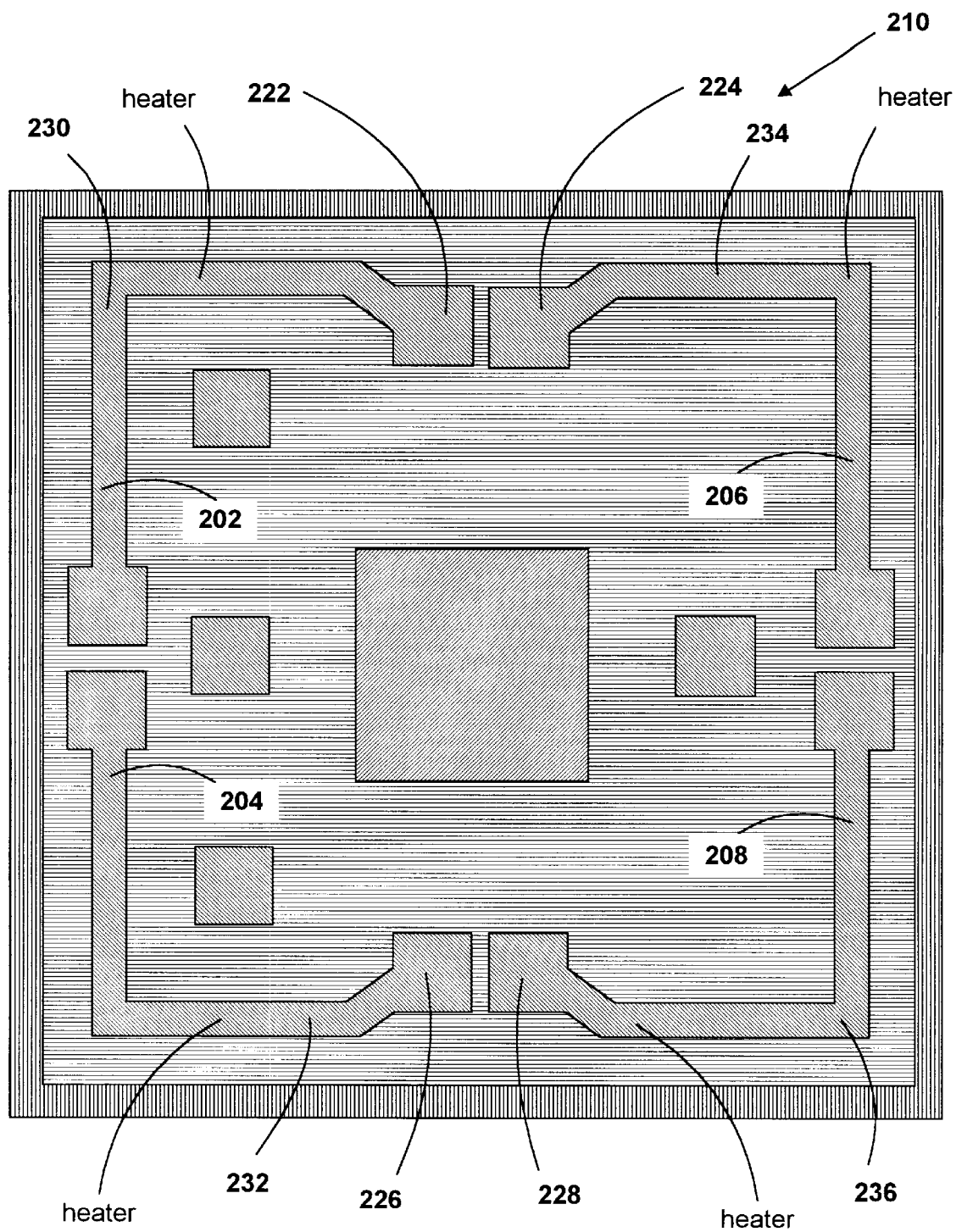
FIG. 4 is a schematic diagram of another alternative embodiment of a monolithic die heater of the present invention.

FIG. 4 illustrates another alternative embodiment of the heater resistor of the present invention constructed as four segments. Voltage reference 210 includes left upper resistor segment 202, left lower resistor segment 204, right upper resistor segment 206, and right lower resistor segment 208. Left upper resistor segment 202 terminates at a first end at pad 222, and at a second end at pad 230. Left lower resistor segment 204 terminates at a first end at pad 232, and at a second end at pad 226. Right upper resistor segment 206 terminates at a first end at pad 224, and at a second end at pad 234. Right lower resistor segment 208 terminates at a first end at pad 236, and at a second end at pad 228. Prior to packaging, pads 230 and 232 are electrically connected, pads 226 and 228 are electrically connected, and pads 234 and 236 are electrically connected, such as by wire bonding, connecting in series left upper segment 202, left lower segment 204, right lower segment 208 and right upper segment 206.

Integrated circuits increasingly include large electronic systems on a single semiconductor die. For example, integrated circuit analog-to-digital (A/D) converters, modems and disk drive controllers, often include a voltage reference circuit along with other analog and digital circuits such as switched-capacitor filters and logic and control circuits. To measure the temperature coefficient of the voltage reference circuit on such large systems, it is desirable to quickly and uniformly heat only the portion of the die that contains the voltage reference circuit.

Figure 5:
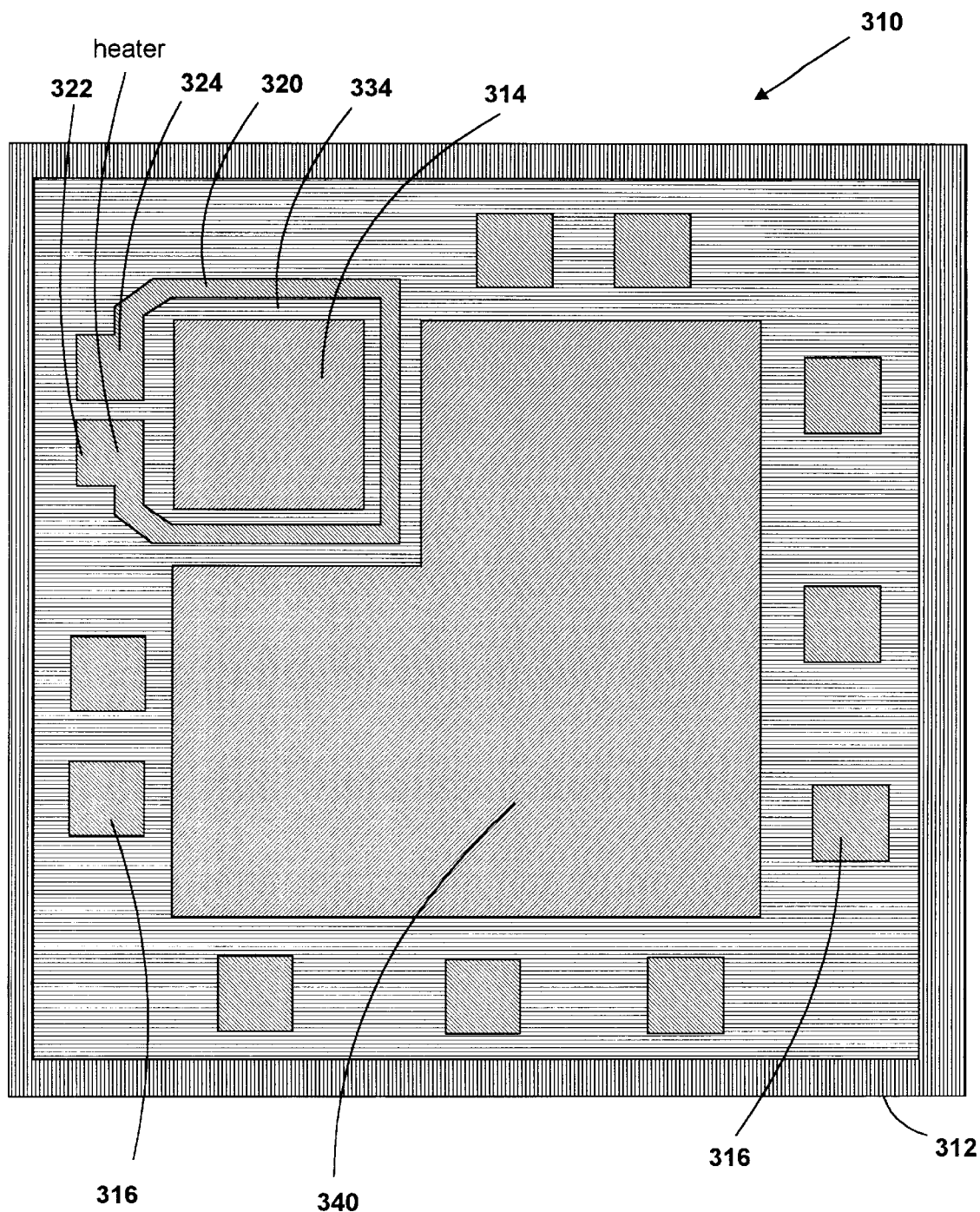
FIG. 5 is a schematic diagram of still another alternative embodiment of a monolithic die heater of the present invention.

FIG. 5 illustrates an alternative embodiment of the present invention for such integrated circuits. Integrated circuit 310 is fabricated on die 312, which includes voltage reference circuit 314, bonding pads 316, heater resistor 320, first heater pad 322, second heater pad 324, and system circuits 340. Voltage reference circuit 314 includes the circuit components that comprise the voltage reference. System circuits 340 include circuitry that constitutes, for example, an A/D converter, modem, or disk drive controller. Heater resistor 320 is fabricated using interconnect metal, and is disposed around periphery 334 of voltage reference circuit 314. Heater resistor 320 terminates at a first end at pad 322, and at a second end at pad 324. Die 312 typically is mounted in a package having pins that are connected to pads 316, 322 and 324.

Figure 6:
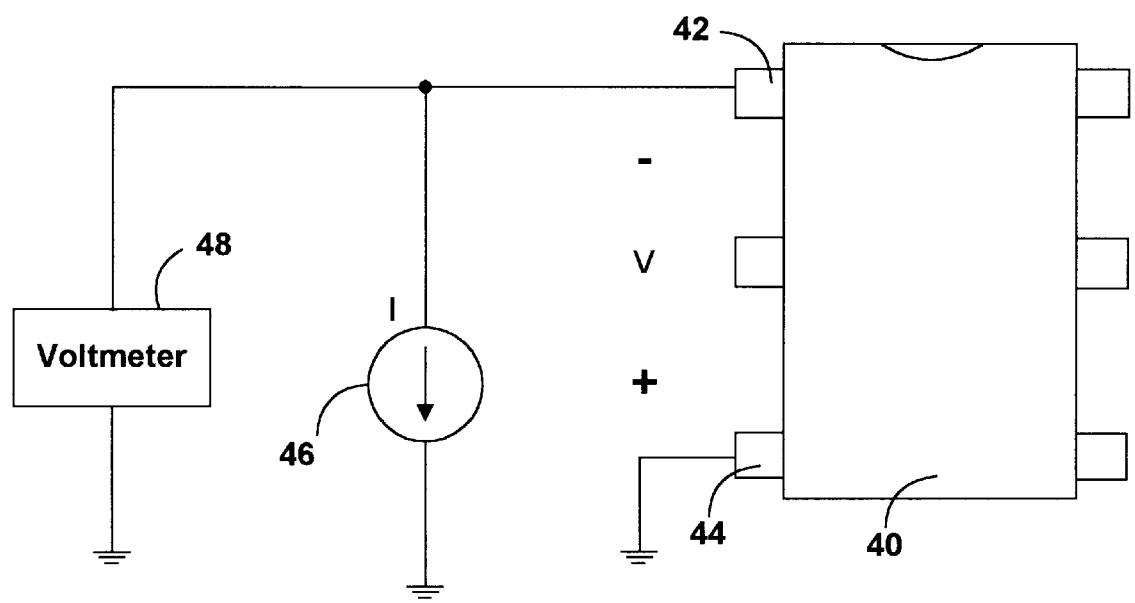
FIG. 6 is a schematic diagram of a circuit used in connection with a monolithic die heater of the present invention.

Referring to FIGS. 1 and 6, the operation of heater resistor 20 is described. Die 12 is mounted in packaged part 40, having heater pin 42 bonded internally to pad 24 and substrate pin 44 bonded internally to pad 22 (in this instance, substrate 32 is p-type and pad 22 includes a substrate contact and serves as both the substrate pad and a pad for the first end of heater resistor 20). Current source 46 is connected between heater pin 42 and GROUND, and substrate pin 44 is connected to GROUND.

Current source 46 pulls current I out of heater pin 42, causing voltage drop V across heater resistor 20. Voltmeter 48, coupled between heater pin 42 and GROUND, monitors voltage drop V. By measuring voltage V, and adjusting current I, power P dissipated in resistor 20 can be set to a desired value.

For example, if current I is set to 500 milliamps (mA), and heater resistor 20 equals 4.6Ω, voltmeter 48 measures voltage drop V equal to 2.3 V. Power P dissipated in resistor 20 equals the product of voltage drop V and current I, which in this example equals 1.15 watts. Applicants have observed that if the energy consumed by heater resistor 20 is approximately 2 watt-seconds, the temperature of die 12 (in an SO-8 package) increases by approximately 75–80° C. above ambient temperature. Thus, by monitoring current I and voltage drop V, the total power dissipation and energy consumption of heater resistor 20 may be controlled independent of the absolute value of heater resistor 20.

Figure 7:
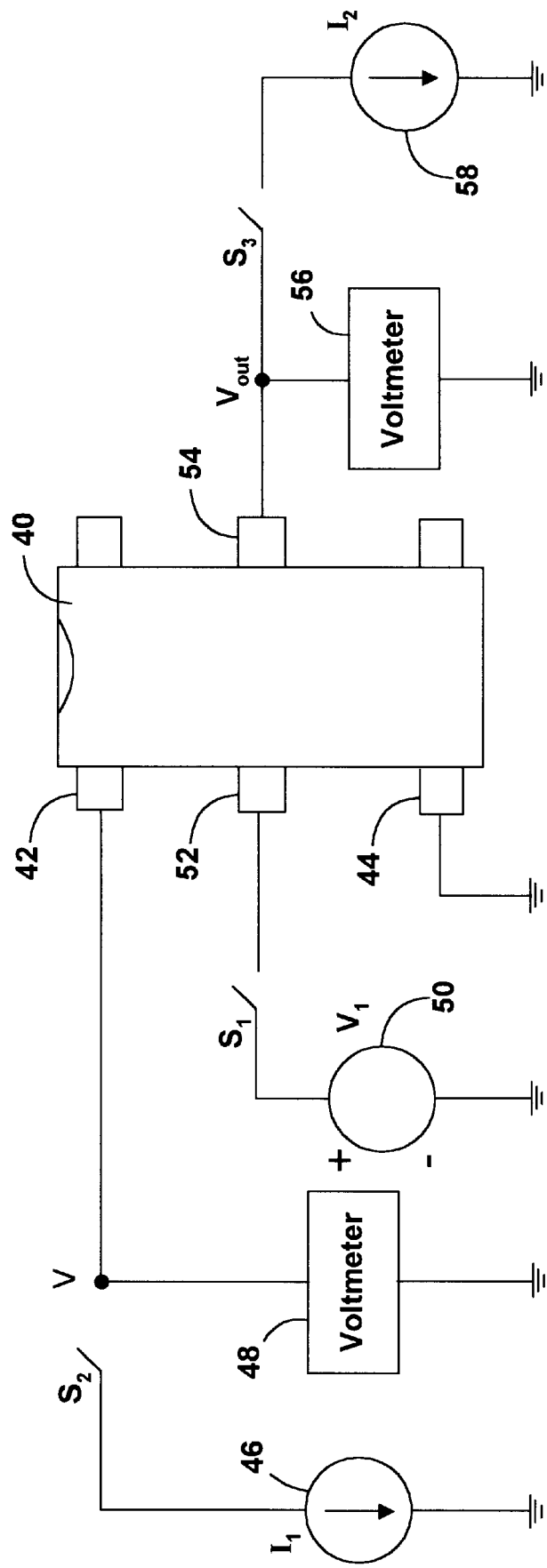
FIG. 7 is an exemplary test circuit used to measure the temperature coefficient of a voltage reference that includes a monolithic die heater of the present invention.

FIG. 7 illustrates an exemplary test setup of a voltage reference incorporating the monolithic die heater of the present invention for an integrated circuit fabricated on a p-type substrate. Packaged part 40 includes input pin 52 bonded internally to input power pad 26, and output pin 54 bonded internally to output pad 30. DC voltage source 50 is coupled through switch $S_1$, to input pin 52. Current source 46 is coupled through switch $S_2$ across voltmeter 48, which is connected between heater pin 42 and GROUND. Substrate pin 44 is coupled to GROUND, coupling substrate 32 and the first end of heater resistor 20 to GROUND (because pad 22 has been modified to serve as both the substrate contact and a contact for the first end of heater resistor 20). Current source 58 is coupled through switch $S_3$ across voltmeter 56, which is connected between output pin 54 and GROUND.

To measure the temperature dependence of the output voltage of the voltage reference, $V_{OUT}$ is first measured ($V_{OUT1}$) at a first predetermined temperature TEMP1 (e.g., room temperature), and a first voltage proportional to temperature ($V_{PT1}$) of die 12 is monitored. Next, a predetermined power P1 is dissipated in heater resistor 20 for a predetermined time T1. Then, a second voltage proportional to temperature ($V_{PT2}$) of die 12 is monitored until die 12 reaches a second predetermined temperature TEMP2 above TEMP1. By knowing the temperature coefficient $TC_{VPT}$ of the voltage proportional to temperature of die 12, the difference between the first and second temperatures can easily be determined. Finally, $V_{OUT}$ is again measured ($V_{OUT2}$), and the temperature coefficient (TC) of $V_{OUT}$ may be calculated as:

$$TC = TC_{VPT} * \frac{V_{OUT2} - V_{OUT1}}{V_{PT2} - V_{PT1}} \qquad (1)$$

In particular, with packaged part 40 at a first predetermined temperature TEMP1(e.g., room temperature), switch $S_1$, is closed, switches $S_2$ and $S_3$ are opened, voltage source 50 applies voltage $V_1$ to input pin 52, and voltmeter 56 monitors the reference voltage $V_{OUT1}$ generated at $V_{OUT}$. Next, switch $S_1$ is opened, switch $S_3$ is closed, and current source 58 pulls current $I_2$ from output pin 54. Pulling current out of output pin 54 when the voltage reference circuits 14 are not powered activates a substrate diode (not shown) on die 12. The substrate diode has a temperature coefficient $TC_{VPT}$ of approximately –0.002 V/° C. Thus, voltmeter 56 measures first voltage proportional to temperature $V_{PT1}$.

Next, switch $S_3$ is opened and switch $S_2$ is closed, activating heater resistor 20. Voltmeter 48 monitors voltage V while current $I_1$ of current source 46 is adjusted to dissipate a predetermined power $P_1$ in heater resistor 20 for a predetermined time $T_1$. For example, if P1 is approximately 1 watt, and T1 is approximately 2 seconds, heater resistor 20 will consume approximately 2 watt-seconds, and thereby raise the temperature of die 12 (in an SO-8 package) by approximately 75–80° C. above TEMP1.

After time T1, switch $S_2$ is opened and switch $S_3$ is closed, and voltmeter 56 is again used to measure $V_{OUT}$ to determine the second voltage proportional to temperature $V_{PT2}$. Voltmeter 56 may be used to continuously monitor $V_{OUT}$ until the voltage reaches a desired value $V_{PT2}$ below $V_{PT1}$. For example, if the second predetermined temperature TEMP2 is 30° C. above TEMP1, voltmeter 56 should be monitored until $V_{OUT}$ has a value equal to $V_{PT1}$ –0.060 volts (i.e., $V_{PT1}$ –0.002 V/° C.×30° C.).

Once the temperature of die 12 falls to TEMP2, switch $S_3$ is opened and switch $S_1$ is closed, once again connecting voltage source 50 to input pin 52. Voltmeter 56 is used to measure the reference voltage $V_{OUT2}$ generated at $V_{OUT}$. Based on these measurements, the temperature coefficient of voltage reference 10 may then be calculated as set forth above in equation (1).

Figure 8:
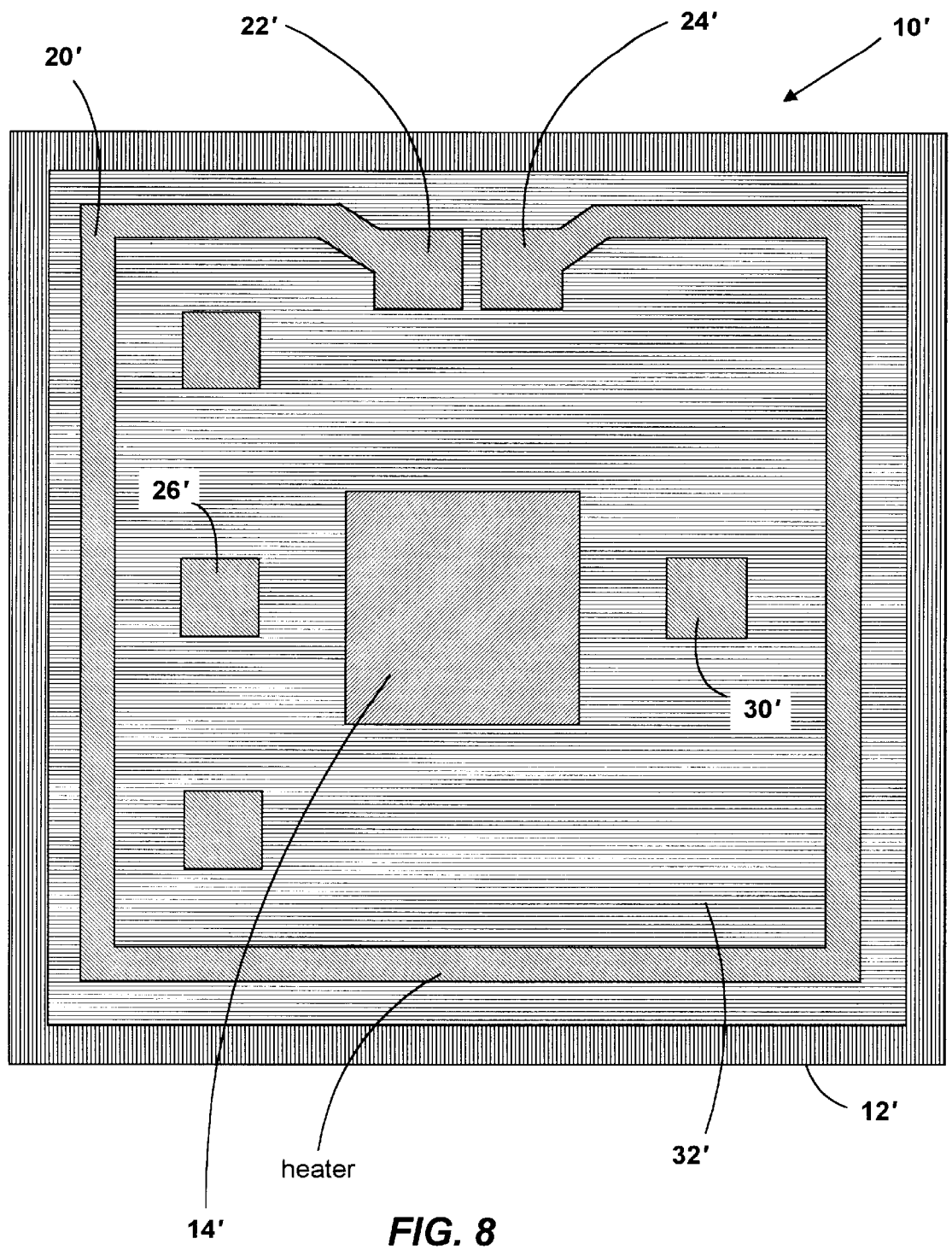
FIG. 8 is a schematic diagram of an illustrative embodiment of another monolithic die heater of the present invention.

FIG. 8 illustrates another exemplary embodiment of a monolithic die heater of the present invention. Voltage reference 10' is fabricated on die 12', which includes voltage reference circuit 14', heater resistor 20', first heater pad 22', second heater pad 24', GROUND pad 26' and output pad 30'. Substrate 32' is n-type semiconductor.

Heater resistor 20' terminates at a first end at pad 22', and terminates at a second end at pad 24'. Pad 22' may be a bonding pad dedicated to heater resistor 20'. Alternatively, as in this embodiment, pad 22' may be used as an input power pad and a substrate contact as well as a contact for the first end of heater resistor 20'. In this manner, input/heater pad 22' ties substrate 32' to the most positive chip voltage, and thereby prevents n-type substrate 32' from being forward-biased.

Figure 9:
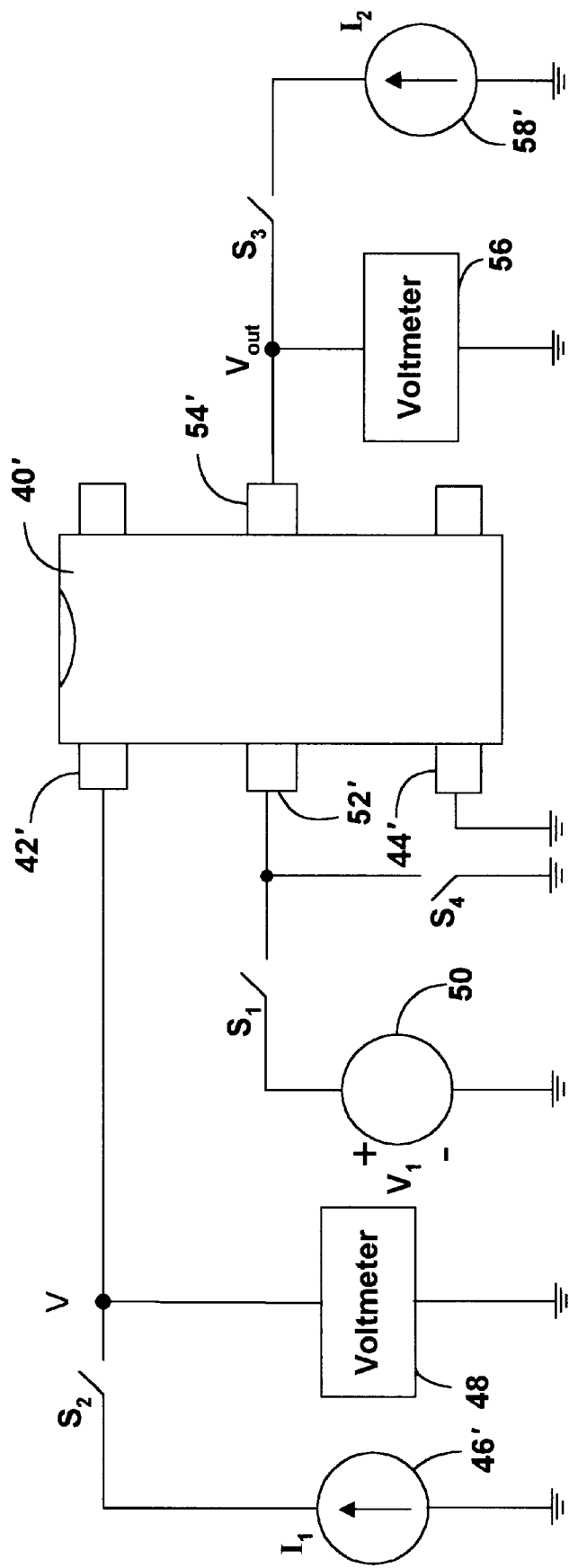
FIG. 9 is an alternative test circuit used to measure the temperature coefficient of a voltage reference that includes a monolithic die heater of the present invention.

FIG. 9 illustrates an exemplary test setup of a voltage reference incorporating the monolithic die heater of the present invention for an integrated circuit fabricated on an n-type substrate. Packaged part 40' includes heater pin 42' bonded internally to heater pad 24', GROUND pin 44' bonded internally to GROUND pad 26', input/heater pin 52' bonded internally to input/heater pad 22', and output pin 54' bonded internally to output pad 30'. DC voltage source 50 is coupled through switch $S_1$ to input/heater pin 52'. Current source 46' is coupled through switch $S_2$ across voltmeter 48, which is connected between heater pin 42' and GROUND. Current source 58' is coupled through switch $S_3$ across voltmeter 56, which is connected between output pin 54' and GROUND. Switch $S_4$ is coupled between input/heater pin 52' and GROUND.

The temperature dependence of the output voltage of voltage reference 10' is determined in a similar manner as the embodiment of FIG. 6. In particular, with packaged part 40' at first predetermined temperature TEMP1 (e.g., room temperature), switch $S_1$ is closed, switches $S_2$, $S_3$ and $S_4$ are opened, voltage source 50 applies voltage $V_1$ to input/heater pin 52', and voltmeter 56 monitors the reference voltage $V_{OUT1}$ generated at $V_{OUT}$. Next, switch $S_1$ is opened, switches $S_3$ and $S_4$ are closed, and current source 58' injects current $I_2$ into output pin 54'. Closing switch $S_4$ ties n-channel substrate 32' to GROUND. Injecting current $I_2$ into output pin 54' when the voltage reference circuits are not powered activates a substrate diode (not shown) on die 12'. The substrate diode has a temperature coefficient $TC_{VPT}$ of approximately $-0.002$ V/° C. Thus, voltmeter 56 measures a first voltage proportional to temperature $V_{PT1}$.

Next, switch $S_3$ is opened, switch $S_4$ remains closed and switch $S_2$ is closed, activating heater resistor 20'. Voltmeter 48 monitors voltage V while current $I_1$ of current source 46' is adjusted to dissipate a predetermined power P1 in heater resistor 20' for a predetermined time T1. For example, if P1 is approximately 1 watt, and $T_1$ is approximately 2 seconds, heater resistor 20' will consume approximately 2 watt-seconds, and thereby raise the temperature of die 12 (in an SO-8 package) by approximately 75–80° C. above TEMP1.

After time $T_1$, switch $S_2$ is opened, switch $S_4$ remains closed and switch $S_3$ is closed, and voltmeter 56 is again used to measure $V_{OUT}$ to determine a second voltage proportional to temperature $V_{PT2}$. Voltmeter 56 may be used to continuously monitor $V_{OUT}$ until the voltage reaches a desired value $V_{PT2}$ below $V_{PT1}$. For example, if the second predetermined temperature TEMP2 is 30° C. above TEMP1, voltmeter 56 should be monitored until $V_{OUT}$ has a value $V_{PT1}$ $-0.060$ volts (i.e., $V_{PT1}$ $-0.002$ V/° C.$\times$30° C.).

Once the temperature of die 12' falls to TEMP2, switches $S_3$ and $S_4$ are opened and switch $S_1$ is closed, once again connecting voltage source 50 to input/heater pin 52'. Voltmeter 56 is used to measure the reference voltage $V_{OUT2}$ generated at $V_{OUT}$. Based on these measurements, the temperature coefficient of voltage reference 10' may then be calculated as set forth above in equation (1).

Note that although the above examples described method and apparatus for measuring the temperature coefficient of the output voltage of the voltage reference, the principles of the present invention also may be applied to measure the temperature coefficient of any integrated circuit parameter. For example, the metal die heater of the present invention may be used to heat a die for purposes of measuring the temperature coefficient of a reference current, a bipolar transistor base-emitter drop, the resistance of an integrated circuit resistor, or other similar parameter.

Figure 10:
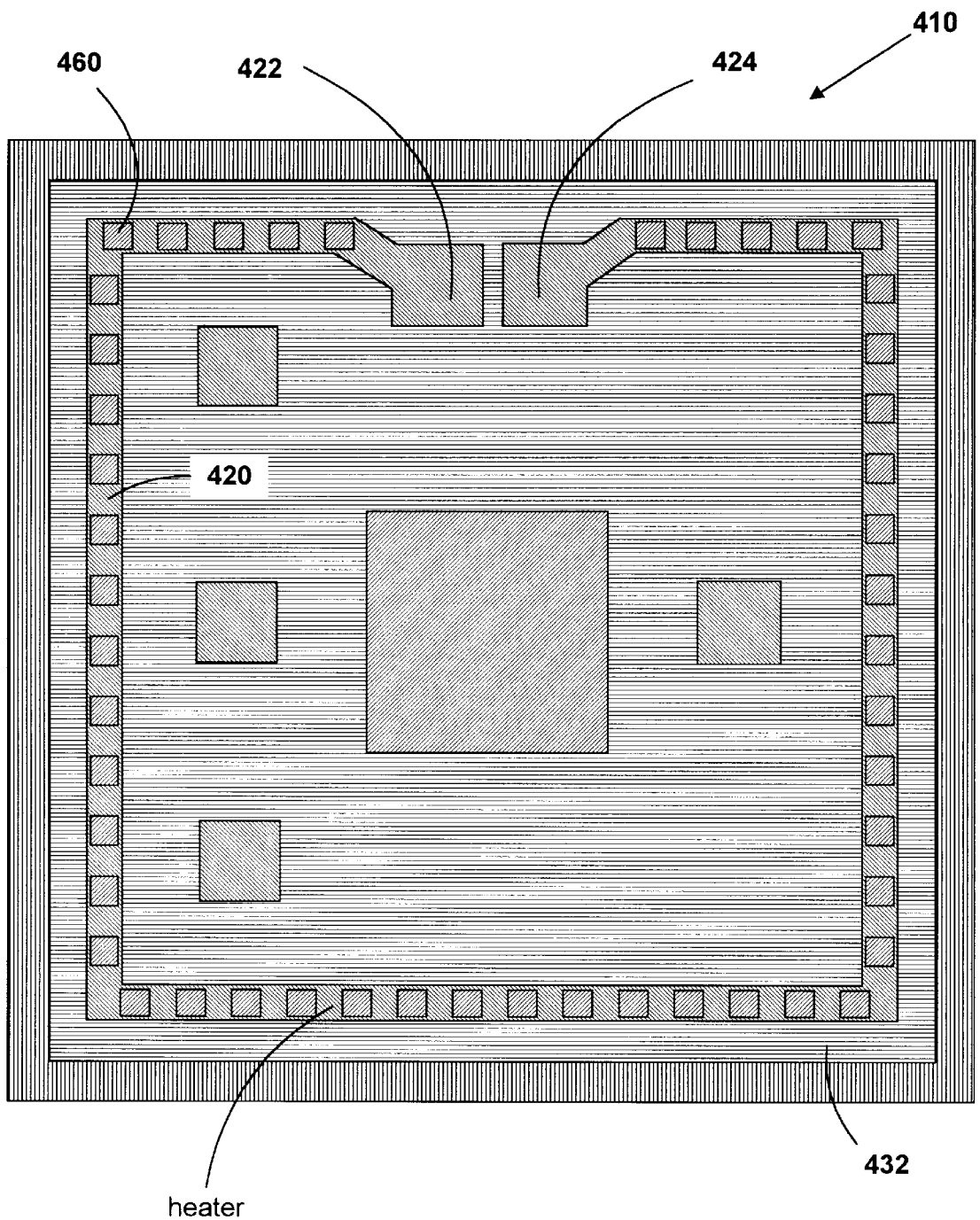
FIG. 10 is an alternative embodiment of a monolithic die heater of the present invention.
Figure 11:
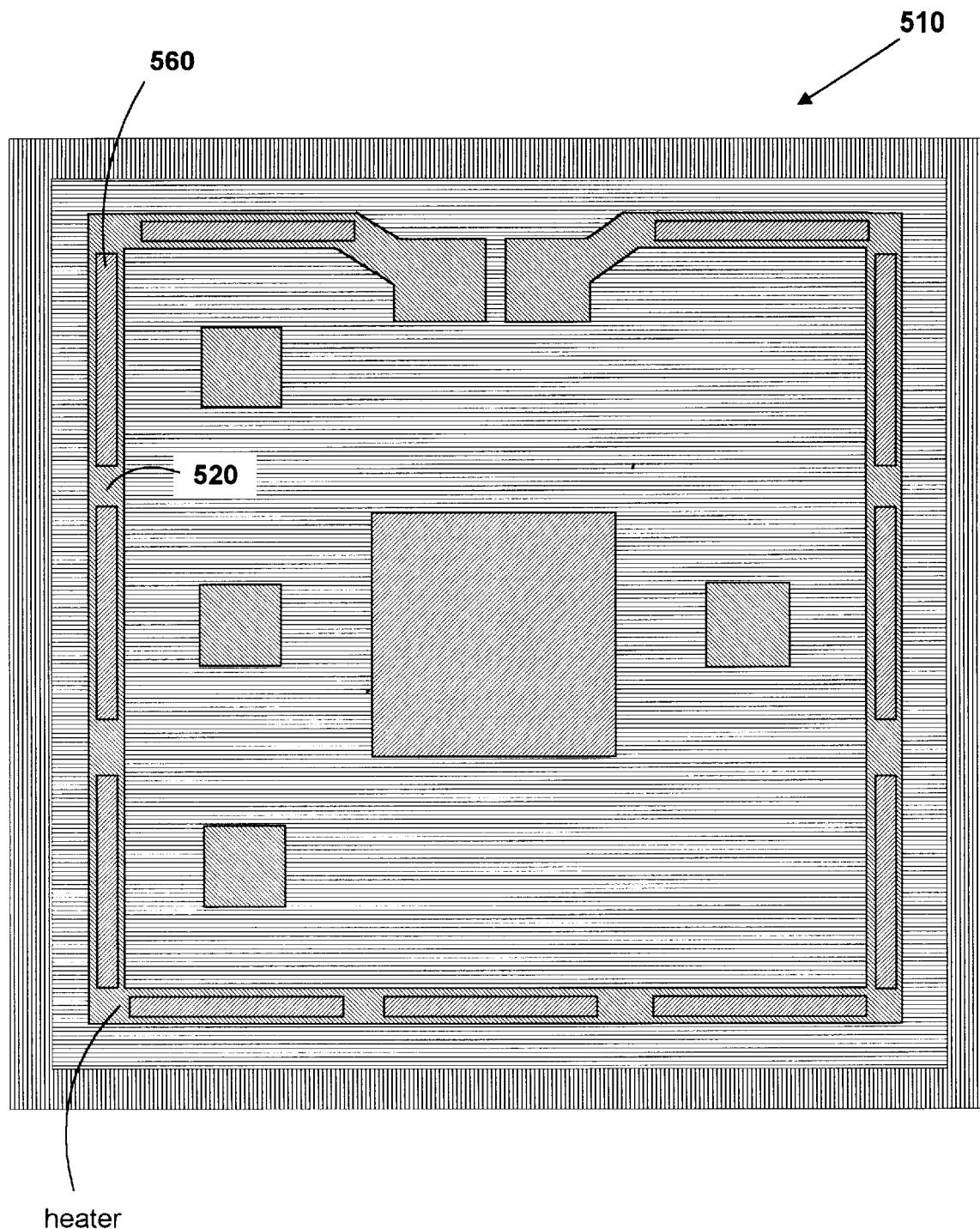
FIG. 11 is another alternative embodiment of a monolithic die heater of the present invention.

Referring to FIGS. 10 and 11, additional alternative embodiments of the monolithic substrate heater of the present invention are described. In FIG. 10, heater resistor 420 includes multiple metal-to-substrate contacts 460 disposed along the entire length of heater resistor 420 between pads 422 and 424. Contacts 460 permit heat dissipated in heater resistor 420 to make better thermal contact directly with substrate 432. Similarly, FIG. 11 shows heater resistor 520 including multiple metal-to-substrate contacts 560 disposed along the entire length of heater resistor 520 to achieve a similar purpose.

Persons skilled in the art further will recognize that the circuitry of the present invention may be implemented using circuit configurations or materials other than those shown and discussed above. All such modifications are within the scope of the present invention, which is limited only by the claims that follow.

What is claimed is:

1. An integrated circuit die comprising a layer of interconnect metal and a periphery, the die further comprising:
   a heater resistor comprising the interconnect metal, the heater resistor disposed around the periphery.

2. The integrated circuit die of claim 1, wherein the die further comprises a plurality of bonding pads.

3. The integrated circuit die of claim 2, wherein:
   the plurality of bonding pads comprises first and second bonding pads; and
   the heater resistor further comprises a first end coupled to the first bonding pad and a second end coupled to the second bonding pad.

4. The integrated circuit die of claim 3, wherein one of the first and second bonding pads comprises a substrate contact.

5. The integrated circuit die of claim 1, wherein:
   the die further comprises a scribe area and a plurality of bonding pads; and
   the heater resistor is disposed between the scribe area and the plurality of bonding pads.

6. The integrated circuit of claim 5, wherein:
   the plurality of bonding pads comprise first and second bonding pads; and
   the heater resistor has a first end coupled to the first bonding pad and a second end coupled to the second bonding pad.

7. The integrated circuit of claim 6, wherein one of the first bonding pad and the second bonding pad comprises a substrate contact.

8. The integrated circuit die of claim 1, wherein the heater resistor has a length and comprises a plurality of metal-to-substrate contacts disposed along the length.

9. The integrated circuit die of claim 8, wherein the die further comprises a plurality of bonding pads.

10. The integrated circuit die of claim 9, wherein:
    the plurality of bonding pads comprises first and second bonding pads; and
    the heater resistor further comprises a first end coupled to the first bonding pad and a second end coupled to the second bonding pad.

11. The integrated circuit die of claim 1, wherein the die further comprises a voltage reference circuit.

12. An integrated circuit die comprising first and second circuits and a layer of interconnect metal, the first circuit having a periphery, the integrated circuit die further comprising:

a heater resistor comprising the interconnect metal, the heater resistor disposed around the periphery.

13. The integrated circuit die of claim 12, wherein the die further comprises a plurality of bonding pads.

14. The integrated circuit die of claim 13, wherein:
the plurality of bonding pads comprises first and second bonding pads; and
the heater resistor further comprises a first end coupled to the first bonding pad and a second end coupled to the second bonding pad.

15. The integrated circuit die of claim 14, wherein one of the first and second bonding pads comprises a substrate contact.

16. The integrated circuit die of claim 12, wherein the heater resistor has a length and comprises a plurality of metal-to-substrate contacts disposed along the length.

17. The integrated circuit die of claim 16, wherein the die further comprises a plurality of bonding pads.

18. The integrated circuit die of claim 17, wherein:
the plurality of bonding pads comprises first and second bonding pads; and
the heater resistor further comprises a first end coupled to the first bonding pad and a second end coupled to the second bonding pad.

19. The integrated circuit die of claim 12, wherein the first circuit comprises a voltage reference circuit.

20. An integrated circuit die mounted in a package, the die comprising a layer of interconnect metal and a periphery, the die further comprising:
a heater resistor comprising the interconnect metal, the heater resistor disposed around the periphery.

21. The integrated circuit of claim 20, wherein the die further comprises a plurality of bonding pads.

22. The integrated circuit of claim 21, wherein:
the plurality of bonding pads comprises first and second bonding pads;
the heater resistor further comprises a first end coupled to the first bonding pad and a second end coupled to the second bonding pad; and
the package comprises first and second pins, the first pin coupled to the first bonding pad, and the second pin coupled to the second bonding pad.

23. The integrated circuit of claim 22, wherein one of the first and second bonding pads comprises a substrate contact.

24. The integrated circuit of claim 20, wherein:
the die further comprises a scribe area and a plurality of bonding pads; and
the heater resistor is disposed between the scribe area and the plurality of bonding pads.

25. The integrated circuit of claim 24, wherein:
the plurality of bonding pads comprise first and second bonding pads; and
the heater resistor has a first end coupled to the first bonding pad and a second end coupled to the second bonding pad.

26. The integrated circuit of claim 25, wherein one of the first bonding pad and the second bonding pad comprises a substrate contact.

27. A method of heating an integrated circuit die comprising a layer of interconnect metal and a periphery, the method comprising:
disposing a heater resistor around the periphery of the die, the heater resistor comprising the interconnect metal; and
conducting a current through the heater resistor.

28. The method of claim 27, further comprising dissipating a predetermined power in the heater resistor.

29. The method of claim 28, further comprising dissipating the predetermined power for a predetermined time.

30. The method of claim 27, further comprising consuming a predetermined quantity of energy in the heater resistor.

31. The method of claim 27, further comprising:
monitoring a power dissipated by the heater resistor;
adjusting the current to dissipate a predetermined power in the heater resistor; and
after a predetermined time, discontinuing the conducting step.

32. The method of claim 27, wherein the heater resistor comprises first and second ends, the method further comprising:
disposing first and second bonding pads on the integrated circuit die;
coupling the first end of the heater resistor to the first bonding pad and coupling the second end of the heater resistor to the second bonding pad; and
coupling the first bonding pad to GROUND and coupling a current source between the second bonding pad and GROUND, the current source conducting the current through the heater resistor.

* * * * *